United States Patent [19]
Klick

[11] Patent Number: 5,705,931
[45] Date of Patent: Jan. 6, 1998

[54] METHOD FOR DETERMINING ABSOLUTE PLASMA PARAMETERS

[75] Inventor: Michael Klick, Berlin, Germany

[73] Assignee: Adolph Slaby Instituut Forschungsgesellschaft fur Plasmatechnologie und Mikrostrukturierung mbH, Berlin, Germany

[21] Appl. No.: 529,020

[22] Filed: Sep. 15, 1995

[30] Foreign Application Priority Data

Dec. 21, 1994 [DE] Germany ............... 44 45 762.6

[51] Int. Cl.$^6$ ............... G01N 27/70; H05H 1/46
[52] U.S. Cl. ............... 324/464; 73/30.04; 315/111.21; 436/153
[58] Field of Search ............... 324/459, 464, 324/465; 73/30.01, 30.04, 31.05; 315/111.21; 436/153

[56] References Cited

U.S. PATENT DOCUMENTS

| | | | |
|---|---|---|---|
| 5,053,343 | 10/1991 | Vora et al. | 436/153 |
| 5,175,472 | 12/1992 | Johnson, Jr. et al. | 315/111.21 |
| 5,471,115 | 11/1995 | Hikosaka | 315/111.21 |
| 5,565,737 | 10/1996 | Keane | 315/111.21 |
| 5,572,137 | 11/1996 | Jones | 324/464 |
| 5,576,629 | 11/1996 | Turner et al. | 315/111.21 X |

OTHER PUBLICATIONS

R.J. Seebock, R. Deutsch and E. Rauchle; "Electric current oscillations in a parallel–plate plasma reactor"; J.Vac.Sci.Technol.A11(3), May/Jun. 1993, pp. 682–688.

Russ A. Morgan; "Plasma Etching in Semiconductor Fabrication"; 1985 (month unavailable); pp. 202–221.

J.D. Johnson and A.J.T. Holmes; "Edge effect correction for small planar Langmuir probes"; Rev.Sci.Instrum. 61(10) Oct. 1990; pp.2628–2631.

K. Kobayashi, N. Mutsukura and Y. Machi; "Electrical measurements in a 13.56 MHz radio frequency discharge"; Vacuum, vol. 42, No. 12, 1991 (month unavailable); pp. 741–744.

V.A. Godyak and O.A. Popov; Experimental study of resonant rf discharges; Sov.J. Plasma Phys. 5(2), Mar.–Apr. 1979; pp. 227–231.

R.S. Harp and F.W. Crawford; "Characteristics of the Plasma Resonance Probe"; J. Appl. Phys., vol. 35, No. 12, Dec. 1964; pp. 3436–3446.

V.A. Godyak and R.B. Piejak; "Probe measurements of the space potential in a radio frequency discharge"; J. Appl.Phys. 68 (7), 1 Oct. 1990; pp. 3157–3162.

V.A. Godyak, R.B. Piejak and B.M. Alexandrovich; "Electrical Characteristics of Parallel–Plate RF Discharges in Argon"; IEEE Transactions on Plasma Science, vol. 19, No. 4, Aug. 1991; pp. 660–676.

*Primary Examiner*—Glenn W. Brown
*Attorney, Agent, or Firm*—Ware, Fressola, Van der Sluys & Adolphson LLP

[57] ABSTRACT

In accordance with the method of the present invention, the radio frequency discharge current generated in a plasma reactor is measured in the form of analog signals at a portion of the reactor acting as an earth electrode. The analog signals are converted into digital signals, and plasma parameters are evaluated from the digital signals by means of a mathematical algorithm.

6 Claims, 5 Drawing Sheets

METHOD FOR DETERMINING ABSOLUTE PLASMA PARAMETERS

BACKGROUND OF THE INVENTION

The invention relates to a method for determining of absolute plasma parameters of unsymmetrical radio frequency (RF) low-pressure plasmas. The invention further relates to an apparatus particularly for measuring of the radio frequency discharge current at a portion of a plasma reactor acting as ground electrode or earth electrode.

In physics, the meaning of the term "plasma" is that of an ionized gas. In this process, a gas molecule is ionized, i.e. a gas molecule is split up into a free electron and a positive ion (ionized molecule). This process often is an electron collision ionization. The feeding of a radio frequency alternating electric field leads to an accumulation of energy with respect to the electrons for an inelastic collision. The electrons impinge on other gas molecules which are again split up as mentioned before into free electrons and positive ions. A plasma state is formed in the entire reactor by this process. Electrons and ions recombine on the wall since the charge carrier, namely the free electrons and the positive ions, discharge to the walls of the reactor. Thus, a gas molecule is again formed so that an equilibrium is finally established in the reactor.

The radio frequency alternating electric field is generated in the plasma reactor by means of parallel-plates wherein an excited or driven radio frequency (RF) electrode is positioned opposite to an earth electrode. The RF electrode is also called "hot electrode". In the following, the real electrode which electrically forms the earth or ground, which is directly opposed to the RF electrode and which also includes portions of the reactor wall acting as earth, is called "earth electrode". The electrodes of the plasma reactor are normally arranged in a horizontal manner. The RF electrode extends close and in parallel to the bottom wall or to the top wall of the reactor.

In the following, a plasma having an excitation frequency between 10 and 100 MHz and a pressure of 0.1 to 100 Pa, preferably 0.1 to 20 Pa, is called RF low-pressure plasma. Therefore, the gas is held under a predetermined constant pressure (vacuum) in the reactor. It is also possible to continuously feed the gas into the reactor and to continuously discharge the gas from the reactor.

Thus, the plasma processes take place in an evacuated reactor. RF low-pressure plasmas are used in the field of fundamental research and above all in the field of the semiconductor technology. Methods such as plasma etching (PE), reactive ion etching (RIE) and plasma enhanced chemical vapor deposition (PECVD) are for example known.

DESCRIPTION OF THE PRIOR ART

The following methods of plasma diagnostics are substantially known with respect to RF low-pressure plasmas.

The optical methods are above all characterized by emission spectrometric methods wherein the emission may partly be externally excited. This method has the advantage that the test object is influenced in a hardly observable manner; this method however has the disadvantage that only relative measuring results can normally be achieved. Mass spectrometric methods enable the determination of the relative intensity or further the mass selective determination of the ion energy distribution. The determination of absolute values for the particle density or for the current density is normally not possible by reason of the small aperture angle and the non-constant transmission. The determination of local plasma parameters, for example the electron density, the ion density and the electron energy, may be achieved by means of Langmuir probes. Langmuir probes are however only applicable with respect to reactive or layer forming plasmas in a very limited manner. Integral plasma parameters, like for example the average density of electrons, may be determined by means of microwave interferometry. The frequency of the microwaves is above the local electron plasma frequency in order to enable the wave propagation in the plasma. This method normally needs a rigid reference line (in the form of a hollow conductor). Thus, this method is not very flexible. Moreover, the knowledge of the spatial distribution of the density of the electrons is necessary for an exact determination of the average density of the electrons. The spatial distribution of the density of the electrons is additionally to be determined for example by means of a Langmuir probe. Integral plasma parameters may however also be determined by means of resonance probes. These probes use the capability of forming resonances of the plasma including its boundary layers with respect to surrounding solids. Depending on the thickness of the boundary layers, the plasma resonance frequency which may also be called geometric plasma resonance frequency, is always slightly lower than the electron plasma frequency. Resonance probes may not be used with respect to RF discharges since the discharge itself generates a wide spectrum of harmonic oscillations and thus superimposes the response of the external excitation via the resonance probe.

SUMMARY OF THE INVENTION

Accordingly, it is an object of the present invention to provide a method as mentioned above by which absolute plasma parameters may be determined in a reliable and reproducible manner.

It is another object of the present invention to provide an apparatus particularly for measuring of a part of the discharge current at a plasma reactor.

These and other objects are solved by a method for determining of absolute plasma parameters in unsymmetrical radio frequency (RF) low-pressure plasmas characterized by the following steps:

a) measuring of a part of a radio frequency discharge current generated in a plasma reactor in form of analog signals at a part of the reactor acting as earth electrode;

b) converting of the analog signals measured under a) into digital signals; and c) evaluating of the plasma parameters from the digital signals obtained under b).

The present invention is based on a radio frequency measuring system which is insensitive with respect to thin but generally optical dense layers so that the method according to the present invention is relatively insensitive with respect to dirt accumulations, layers of materials and with respect to reactive materials. As a result, the method ensures a high stability over a long time and a good reliability and reproducibility of the absolute plasma parameters determined by the method according to the present invention.

According to a preferred embodiment of the method according to the present invention, at least one resonance frequency of the discharge is determined from how the discharge current is timely developing, wherein the discharge is self-excited on this resonance frequency by means of harmonic oscillations in the discharge current which are generated by virtue of the nonlinearity of the space charge sheath in front of the RF electrode. This resonance frequency is not the electron plasma frequency (Langmuir frequency) which describes the resonance in the plasma itself without participation of the boundary layers (space charge sheathes). This resonance frequency however indicates a geometric resonance being one geometry factor lower than the real plasma frequency. The geometric resonance is distinctly marked with respect to a strong unsymmetrical RF discharge. It is advantageous that a forced, i.e. external, excitation is not necessary because of the self excitation.

The ion energy distribution in the harmonic oscillation in front of the RF electrode is determined from how the discharge current is timely developing wherein the measured discharge current forms a portion independent from the frequency of the entire discharge current and wherein this portion is preferably estimated by means of the area ratios of the part of the reactor acting as earth electrode and the RF electrode. It is advantageous that the average ion energy of the ions during impinging on the surface of the electrodes may be determined from the determined ion density distribution if the temporarily averaged potential difference between the plasma and the RF electrode is known. The average ion energy is an important parameter of the process during treating of a substrate, for example a semiconductor plate, which is positioned on the RF electrode.

It is further advantageous that the damping constant of the system which is dampedly oscillating because of the collision of the electrons with neutral particles of the plasma, is determined from how the discharge current is timely developing. An effective electron-collision rate (also called effective electron collision frequency) may also be determined from the damping constant, said rate being a measure for the collisions of the electrons with the neutral particles of the plasma.

According to a preferred embodiment of the method according to the present invention, the potential fed to the RF electrode or at least the dc part (direct current part) thereof is additionally required for the determination of absolute value of the average thickness of the space charge sheath in front of the RF electrode and/or for the determination of the average ion energy. Thus, important parameters which characterize the plasma and which enable for example conclusions with respect to the etching process, may be determined in a reliable and finally reasonable manner.

The above mentioned objects are further solved by an apparatus particularly for measuring of the radio frequency discharge current at a part of a plasma reactor acting as earth electrode, characterized in that a meter electrode (which may also be called measuring electrode) comprises an electrical insulation on its peripheral surface, and the meter electrode is positioned in a flange or recess of the reactor wall which acts at least as a part of the earth electrode, such that the insulation is at least arranged between meter electrode and wall of the reactor and that the front face of the meter electrode is approximately aligned to the inner wall of the reactor directed to the interior space of the reactor, and in that the front face of the meter electrode is dimensioned in such a manner that the RF potential in the reactor effected by the meter electrode is negligibly small if compared to the potential between plasma and earth electrode.

According to the present invention, the meter electrode enables the measurement of the discharge current at the wall of the reactor wherein the meter electrode forms a virtual portion of the wall. According to the present invention, the RF potential at the meter electrode will be small with respect to the potential between plasma and meter electrode. The predescribed RF potential is between about 5 and 100 mV, preferably between 10 and 20 mV. The RF potential is thus several orders of magnitude below the plasma potential and its RF part.

According to a preferred embodiment of the apparatus according to the present invention, the meter electrode is fixed at the reactor by means of an electrically insulated vacuum feedthrough. The meter electrode comprises a rod shaped electrical conductor which is connected to ground outside the reactor. The electrical conductor is connected with a current transformer which generates a voltage from the measured current. This embodiment represents the first embodiment of the apparatus according to the present invention which has a simple construction and by which usual commercial vacuum feedthroughs may be used. Because of the possible great surface of electrodes, this meter electrode has a relatively high sensitivity.

It is a further advantage that a probe is provided which is fixed at the reactor by means of an electrically insulated vacuum feedthrough, which probe comprises an inner conductor connected with the meter electrode, an insulating body circumferentially surrounding the inner conductor, the insulation of the meter electrode and which probe comprises an outer conductor connected with the reactor wall. The outer conductor should preferably be provided within the flange, but as close as possible to the inner side of the reactor wall. This probe represents the second embodiment of the apparatus according to the present invention. It is further advantageous that such a probe has a high bandwidth with respect to the frequency to be measured. This bandwidth starts from the excitation frequency of the plasma, for example from 13.56 MHz, and goes further than the geometric plasma resonance frequency so that it is possible to measure the discharge current with a frequency of more than 300 MHz up to about 500 MHz.

It is a further advantage that the vacuum feedthrough of the predescribed second embodiment of the apparatus according to the present invention is provided at both sides with a coaxial connection which is connectable to a corresponding counterconnection which is connected to the inner conductor, the insulating body and the outer conductor. Thus, it is possible to form the probe like a coaxial cable even in the reactor up to the actual meter electrode in order to achieve the predescribed bandwidth which should be as wide as possible. The probe may thus be represented in a simple and a reasonable manner by a "cut off" coaxial cable which is directly connected with a meter electrode. Any separation of meter electrode and vacuum feedthrough is easily possible by means of the coaxial connections so that components of the probe may quickly be replaced if desired.

DESCRIPTION OF THE DRAWINGS

A better understanding of the invention will be reached by reference to the following detailed description of embodiments of the subject matter of the present invention when read in conjunction with the accompanying drawing in which.

DETAILED DESCRIPTION OF PREFERRED EMBODIMENTS OF THE INVENTION

Figure 3:
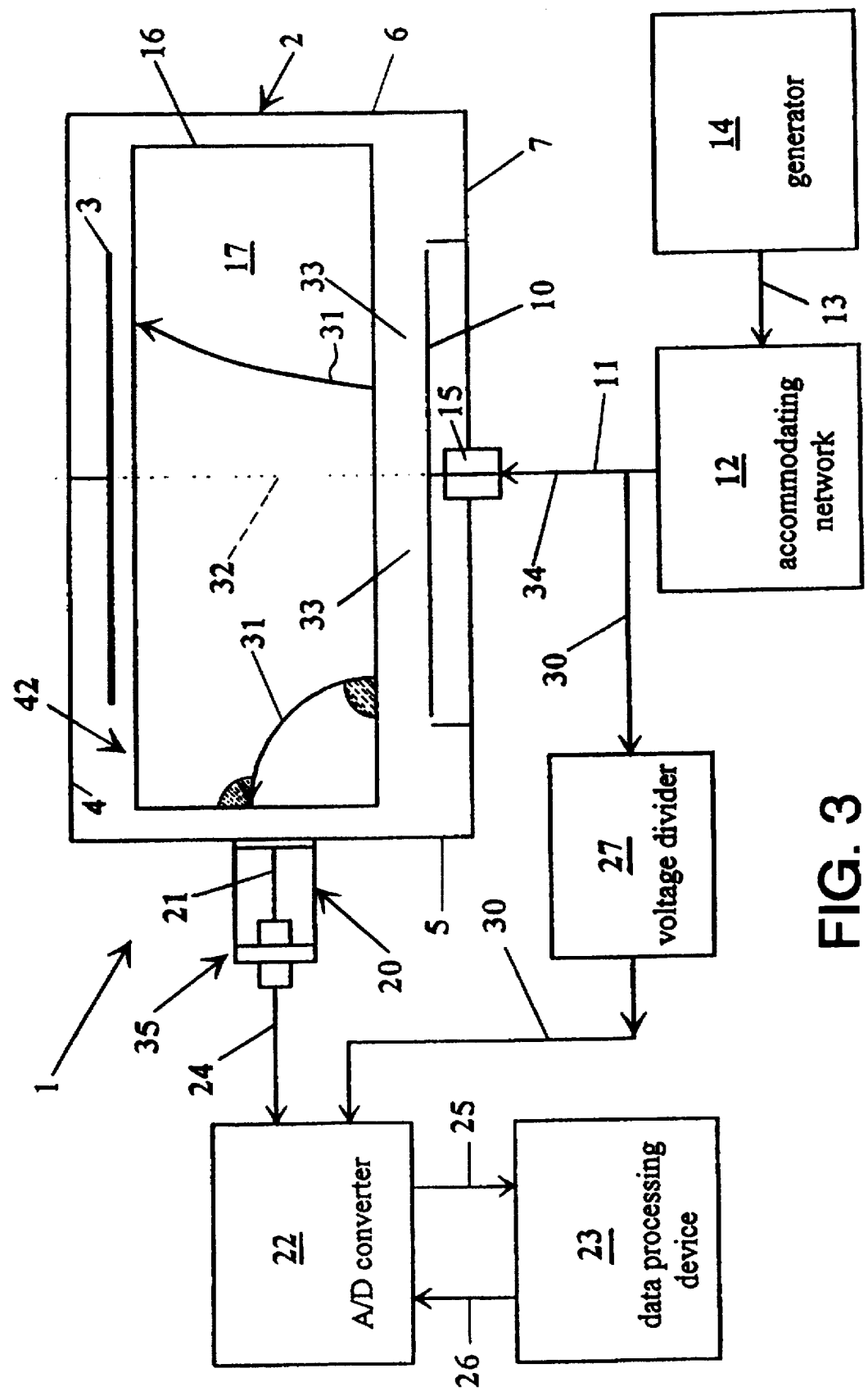
FIG. 3 a schematical view of an apparatus according to the present invention for determining of absolute plasma parameters.

An apparatus 1 for determining of absolute plasma parameters of unsymmetrical radio frequency (RF) low-pressure plasmas is schematically shown in FIG. 3.

An electrode 3 is located in a reactor 2, which is called plasma reactor in the following. The electrode 3 horizontally extends in parallel to the top wall 4 of the reactor 2 and a certain distance apart from said top wall. The electrode 3 is electrically connected to the top wall. The reactor 2 further comprises side walls 5, 6 which are connected with the top wall 4 on the one hand and which are connected to the bottom wall 7 on the other hand.

The radio frequency (RF) electrode 10 extends close to the bottom wall 7 and in parallel thereto in horizontal direction. The electrode 10 is electrically connected by a conductor 11 with an accommodating network 12 and by a further conductor 13 with a generator 14. The generator 14 generates a voltage having a sinusoidal course. The conductor 11 comprises an insulation 15 at least in the region of its leadthrough through the bottom wall 7 so that the RF electrode 10 and the connector 11 are not electrically connected to the bottom wall 7. As already described above, the electrode 3 including the walls 4, 5, 6 and 7 of the reactor 2 is designated as earth electrode in the following. In reactor 2, the plasma 17 is located in the region 16 between the RF electrode 10 and the electrode 3. It is emphasized that in FIG. 3 region 16 is shown in the form of straight lines only for drawing purposes.

A probe 20 is mounted on the side wall 5. By means of this probe, a part of the radio frequency discharge current, namely the part of the current which impinges on meter electrode 21 located in side wall 5, is measured. The probe 20 is connected to an analog/digital (A/D) converter 22, for example a digital storage oscilloscope. The A/D converter 22 is connected to a data processing device 23, for example a personal computer.

The analog signals measured by the probe 20 reach the A/D converter 22 via the conductor 24, which converter 22 converts the analog signals (data) into digital signals and which send the digital signals via the conductor 25 to the data processing device 23. The control of the A/D converter 22 is effected via conductor 26 by means of the data processing device 23.

The conductor 11 connecting the accommodating network 12 with the RF electrode 10 is connected via a voltage divider 27, preferably a probe, with the A/D converter 22 by means of the conductor 30.

In the following, the method according to the present invention is described in detail with respect to FIG. 1 to 3.

By feeding of a radio frequency alternating electric field the gas molecules which are located in the reactor 2 are ionized, i.e. the gas molecules are split up into free electrons and positive ions. In the state of plasma, streamlines 31 are formed in reactor 2, respectively comprising radial and axial components with respect to the axis of symmetry. For purposes of a better survey, only two streamlines 31 are shown in FIG. 3. The streamlines go from the RF electrode 10 to the earth electrode (electrode 3, top wall 4, side walls 5, 6, bottom wall 7). They are perpendicularly located on the RF electrode as well as on the respective part of the earth electrode. For purposes of simplicity, the streamlines 31 in FIG. 3 are only shown within region 16.

A portion of the radio frequency discharge current, namely the portion of the discharge current which impinges on the meter electrode 21, is measured by means of the meter electrode 21 of probe 20. According to FIG. 1, this measured portion of the discharge current $I_p$ is shown versus the normalized time. The following equation is valid for the normalized time:

$$\phi = \omega_0 \cdot t$$

wherein $\omega_0$ designates the excitation frequency [1/s] and t designates the time [s]. This figure is valid for a pressure p of 10 Pa and for an excitation frequency of 13.56 MHz.

Figure 1:
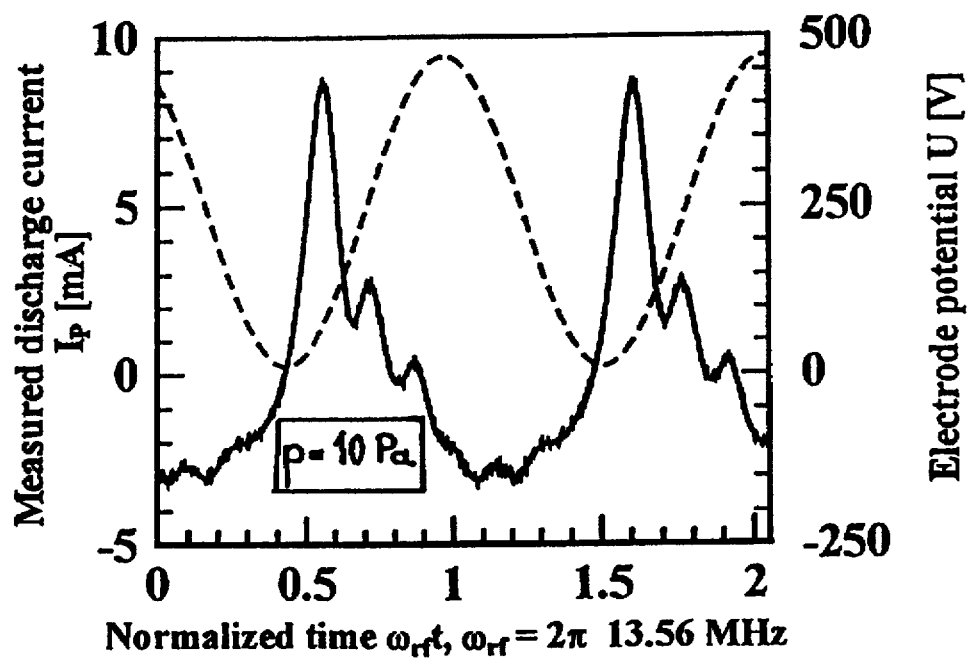
FIG. 1 is a diagram showing the measured part of the discharge current versus the normalized time.
Figure 2:
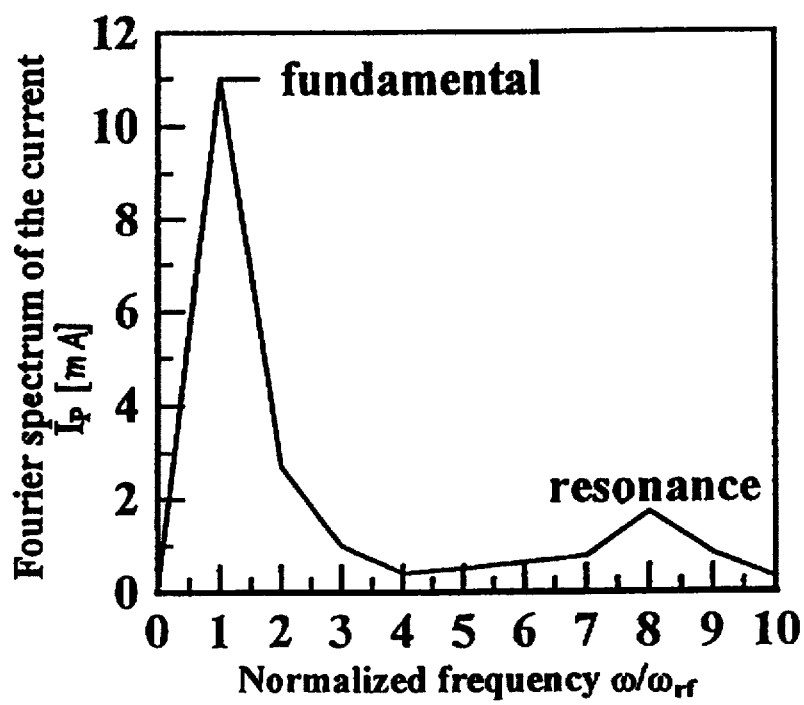
FIG. 2 a diagram showing the Fourier spectrum of the measured current versus the normalized frequency.

Moreover, FIG. 1 shows the electrode potential U versus the normalized time, said potential being fed to RF electrode 10 and electrode 3.

FIG. 1 shows a saw-tooth course together with superimposed oscillations of the measured discharge current over the normalized time. Such a course has the meaning that within the period of one oscillation first of all a steep rise and in the following a gradual drop of the measured current takes place. This saw-tooth course is the result of nonlinear distortions because of the nonlinearity of the space charge sheath 33 in front of the RF electrode 10 (in FIG. 3 above the RF electrode 10). By means of the nonlinearity of the space charge sheath, harmonic oscillations are generated in the discharge current. Since the thickness of the space charge sheath is dependent on the potential difference between the plasma and the RF electrode the space charge sheath acts as a nonlinear capacity. The nonlinear effect of the space charge sheath is considerably affected by the ion density distribution in the space charge sheath in front of the RF electrode 10.

The electrode potential U shown in FIG. 1 versus the normalized time indicates a course which is nearly a sinusoidal oscillation. For purposes of a better understanding, this nearly sinusoidal course is indicated in FIG. 1 by dotted lines.

The discharge consisting of the plasma body and of the space charge sheathes represents an oscillating system by reason of the inert mass of the electrons and the restoring force with respect to the electrical fields in the space charge sheathes between the plasma and the earth electrode on the one side and between the plasma and the RF electrode on the other side. The natural frequency of the oscillating system is below the electron plasma frequency (also called Langmuir frequency). The system is damped by the collisions of the electrons with the neutral particles of the gas so that finally a damped oscillation is performed.

By means of the predescribed nonlinearity of the space charge sheath in front of the RF electrode and the harmonic oscillations in the discharge current resulting therefrom, the plasma is self-excited to oscillations which are distinct adjacent to the resonance frequency. In FIG. 2, a discrete spectrum of the measured values is shown. As a result, the measured discharge current shown in the Fourier spectrum of FIG. 2 indicates a maximum approximately in the region of the 10th to 11th harmonic oscillation. Since in FIG. 2 the Fourier spectrum is shown above the normalized frequency $\omega/\omega_0$, it follows that the resonance frequency $\omega$, is about 10 times greater than the excitation frequency $\omega_0$. It is emphasized that the predescribed resonance frequency does not correspond with the electron plasma frequency $\omega_{pe}$.

According to FIG. 1, about 10 superimposed oscillations are performed within the period of one oscillation. This result coarsely corresponds with the representation in FIG. 2 according to which the resonance frequency occurs in the region between the 10th and 11th harmonic oscillation.

The predescribed serf-excitation of the system is distinct in case of a strongly unsymmetrical radio frequency discharge. During such a discharge, the space charge sheath 33 in front of RF-electrode 10 is the most important. Thus, the space charge sheath in front of the earth electrode can be neglected. Since the self-excitation extends at least up to the 10th harmonic oscillation any external excitation of the system is not necessary.

According to the present invention, the radio frequency discharge current is measured in the form of analog signals by means of the meter electrode 21 of the probe 20 at a part of reactor 2 acting as earth electrode. The radio frequency discharge current is passed via the conductor 24 to the A/D converter 22. Here, the measured analog signals are converted into digital signals. The latter are passed via the conductor 25 to the data processing device 23. The plasma parameters are evaluated by means of a mathematical algorithm from the signals leaving the A/D converter.

The mathematical algorithm is based on a suitable representation of the voltage drop over the space charge sheath in front of the RF electrode according to the displacement flux at the surface of the electrode in the differential equation describing the system. The latter also takes into account the inert mass of the electrons, their collisions with the neutral particles of the gas and the ion current to the wall (earth electrode) or to the RF electrode. By means of a subsequent Fourier-transform the set of parameters comprising the parameters to be determined may be obtained by means of algebraic transformations.

In more detail, the inert mass of the electron can be treated as an inductance and the collisions with neutrals, including power absorption in the expanding sheath, as a resistance. Finally there is the sheath, which acts as a nonlinear capacitance. Therefore the plasma can be regarded as a damped serial oscillation circuit. The nonlinear sheath capacitance excites the plasma by providing harmonic oscillations to damped oscillations close to the geometric resonance frequency, which is below the plasma frequency (Langmuir frequency). The relation of the temporal derivation of the sheath voltage u[V], sheath width s[m] and displacement current i[A]

$$\frac{du}{dt} = \frac{s[u(t)]i(t)}{A_0 \epsilon_0} \qquad (1)$$

indicates the nonlinear properties of the sheath, where $A_0$ denotes the area [m²] of the RF electrode. Using a hydrodynamic approach for the motion of electrons, the known equation for the permittivity $\epsilon$[As/(Vm)] of the "cold" plasma is $$\frac{\epsilon}{\epsilon_0} = 1 - \frac{\omega_e^2}{\omega(\omega - j\nu)}, \quad \omega_e^2 = \frac{e^2 n}{\epsilon_0 m_e} \qquad (2)$$

where $\epsilon_0$ is the permittivity [As/(Vm)] of the free space (vacuum), $\omega_e$ is the (electron) plasma frequency [1/s], $\nu$ is the collision frequency [1/s], e is the elementary charge [As], n is the electron plasma density [1/m³] and $m_e$ is the electron mass [kg]. For vanishing collision frequency $\nu$ equation (2) is called the ECCLES relation. The plasma conductivity can now be written as $$(\omega_e/\omega)^2 >> 1 + (\nu/\omega)^2 \rightarrow \sigma_p = \frac{ne^2}{m_e(j\omega + \nu)} \qquad (3)$$

and the potential drop of the plasma is $$u_p = \frac{m_e l}{A_0 n e^2}\left(\nu i + \frac{d}{dt} i\right). \qquad (4)$$

Neglecting the conduction currents of ions and electrons in the sheath, it is obtained for the whole discharge driven by the voltage $u_{rf}$ at the RF electrode $$\frac{d}{dt} u_{rf} + \frac{s - s[u(t)]}{A_0 \epsilon_0} i = \frac{s}{A_0 \epsilon_0} i + \frac{m_e l}{A_0 n e^2}\left(\nu \frac{d}{dt} i + \frac{d^2}{dt^2} i\right) \qquad (5)$$

which is a nonlinear inhomogeneous differential equation of second order. On the right hand side of the above equation, there is a linear oscillation term with the geometric resonance frequency $\omega_p^2 = \omega_c^2$ s/l for a plasma with small damping, where 1 denotes the geometric length of the plasma.

The dependence of the sheath width s on the displacement current involves a special approach and usually requires a numerical solution of the differential equation (5).

This differential equation can be interpreted using an equivalent circuit. On the one side there is the external excitation—the matchbox including the RF generator. The discharge is treated as a damped oscillating circuit as suggested by the right hand side of equation (5).

Finally it rests the nonlinear phenomena, given by the second term on the left hand side of equation (5), represented by voltage sources as the internal excitation depending on the displacement current and, as a further nonlinear effect, the bias voltage. The nonlinearity of the sheath given by equation (1) provides harmonic oscillations and the oscillating circuit an additional resonance—particularly in the discharge current.

Using the differential equation and the measured discharge current the unknown coefficients can be determined. The electron plasma density, the collision frequency, the plasma resistance and the power dissipated in the plasma body may be calculated.

The predescribed at least one resonance frequency may be determined from how the measured discharge current is timely developping, the discharge being self-excited on said resonance frequency by harmonic oscillations in the discharge current which are generated by reason of the nonlinearity of the space charge sheath in front of the RF electrode. Several resonance frequencies may appear because of two-dimensional components of the current conduction (each streamline 31 in FIG. 3 has an axial and a radial component) and the nonlinearity of the space charge sheath. Only one resonance frequency is obtained at higher pressures. Furthermore, the ion density distribution in the harmonic oscillation in front of RF electrode may be determined from how the discharge current is timely developping, wherein the measured discharge current forms a portion of the entire discharge current, said portion being independent of the frequency. This frequency-independent portion of the entire discharge current is estimated in a first approach by the area ratios of the part of the reactor acting as earth electrode and the RF electrode. With respect to the mathematical model, his portion may also be estimated by the determination of the current dividing factor and the thickness of the electrical space charge sheath in front of the RF electrode. Moreover, the damping constant of the dampedly oscillating system may be determined from how the discharge current is timely developing. Insofar the potential being fed to the RF electrode or at least the dc part thereof is additionally measured for example at a location 34 outside from reactor 2 in FIG. 3, the absolute value of the average thickness of the space charge sheath in front of the RF electrode and the average ion energy may additionally be determined.

By means of the predescribed method, important plasma parameters may be determined in absolute values which definitely characterise the operating conditions in the reactor. One of the important plasma parameters, the electron density averaged over the volume, may easily be determined from the electron plasma frequency (also called Langmuir frequency) or directly from the geometric resonance frequency. By means of these parameters, conclusions may be drawn regarding the state of the plasma and the real case of application, for example an etching process of semiconductor wafers. Thus, it is possible that unsymmetrical radio frequency low-pressure plasmas may reproducibly, i.e. reliably, and quickly be characterized. Therefore, an "in-situ" checking of plasma parameters is possible by means of the method according to the present invention. Dirt accumulations or depositions of layers on the meter electrode below about 0.1 mm do not cause any worth mentioning errors by reason of the only measurement of a radio frequency current. The method according to the present invention may also be used in connection with plasmas having a combined excitation, i.e. a RF excitation and an excitation by means of microwaves since the excitation frequency of the microwaves, about 2.45 GHz, is normally substantially higher than the predescribed RF excitation.

In the following, the apparatus according to the present invention is described with reference to several preferred embodiments. The apparatus according to the present invention is particularly suitable for measuring of a radio frequency discharge current at a part of the plasma reactor acting as earth electrode.

Figure 4:
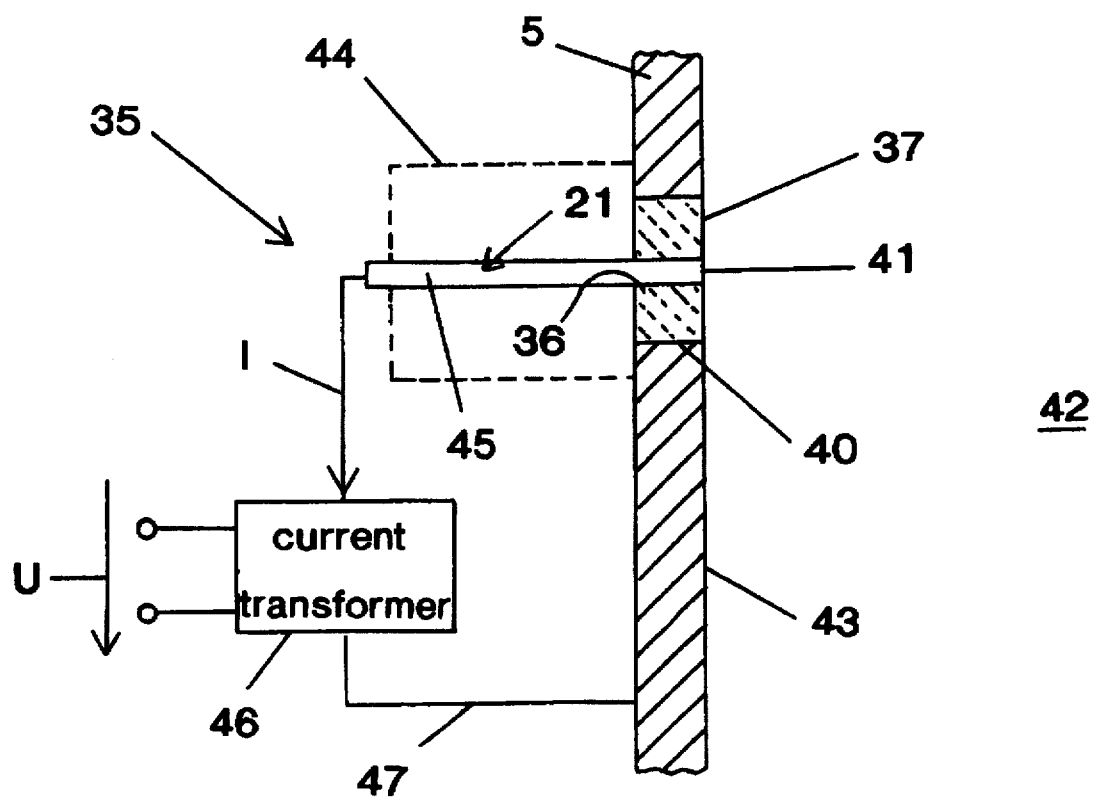
FIG. 4 a schematical view partly in cross-section of an apparatus for measuring of the radio frequency discharge current at a reactor according to a first embodiment of the present invention.
Figure 5:
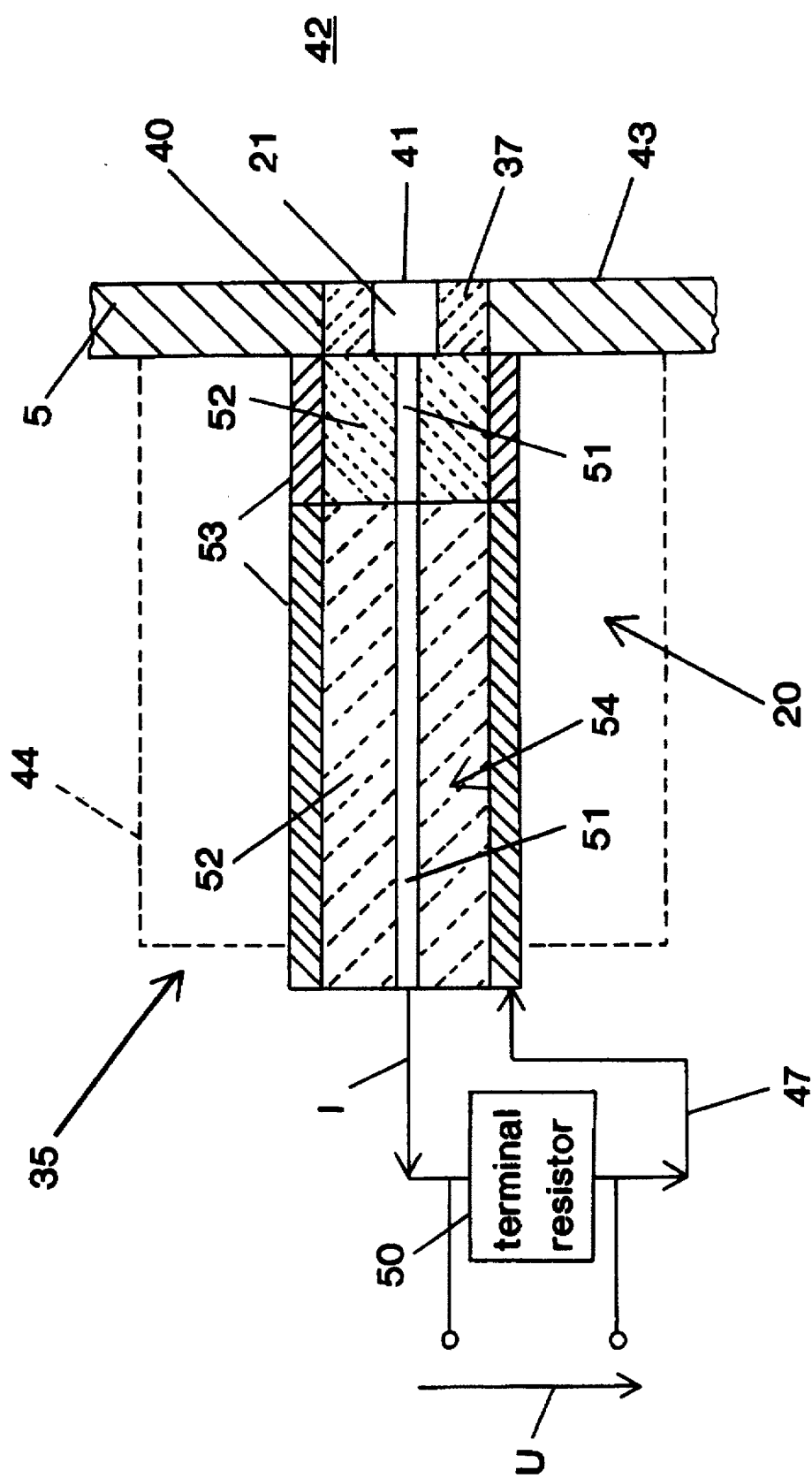
FIG. 5 a schematical view partly in cross-section of an apparatus for measuring of the radio frequency discharge current at a reactor according to a second embodiment of the present invention.
Figure 6:
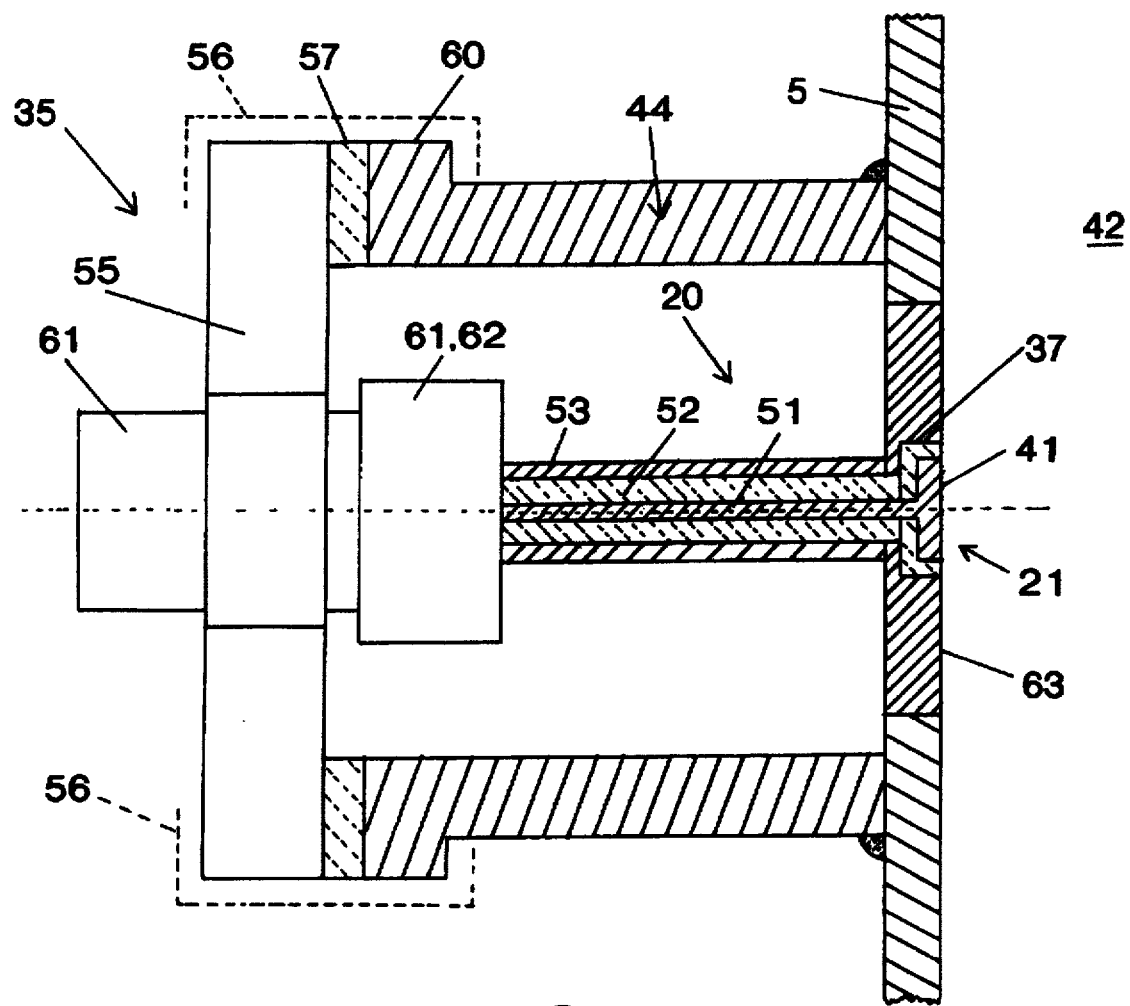
FIG. 6 a schematical view partly in cross-section of an apparatus for measuring of the radio frequency discharge current at a reactor according to a third embodiment of the present invention.

An apparatus 35 for measuring of a radio frequency discharge current at plasma reactor 2 is for example shown in FIG. 4 to 6 wherein the embodiment according to FIG. 6 is also schematically indicated in FIG. 3.

According to the present invention, the meter electrode 21 comprises an electrical insulation 37 on its peripheral surface 36. The insulation 37 is preferably formed like a ring. The meter electrode 21 is positioned in a flange or recess 40 of the reactor wall 5 acting as a part of the earth electrode 3 to 7 such that the insulation 37 is at least arranged between meter electrode 21 and wall 5 of reactor 2 and that the front face 41 of meter electrode 21 is aligned to the inner wall 43 of reactor 2 which inner wall is directed to the interior space 42 of the reactor. Thus, meter electrode 21 and insulation 37 form a part of the wall of the reactor. According to the present invention, the front face 41 of meter electrode 21 is dimensioned in such a manner that the RF potential in reactor 2 effected by meter electrode 21 is negligible with respect to the potential between plasma 17 and earth electrode 3 to 7.

A first embodiment of apparatus 35 is shown in FIG. 4. Meter electrode 21 is mounted on wall 5 of reactor 2 by means of an electrically insulated vacuum feedthrough 44 which is indicated in FIG. 4 by broken lines. The meter electrode 21 comprises a rod-shaped electrical conductor 45 which is grounded outside from the reactor 2. The conductor 45 is connected to a current transformer 46 which generates a voltage U from the measured current I. The current transformer 46 is connected via a conductor 47 again to ground, i.e. to the wall 5 of the reactor. As described above, this voltage U is fed as an input quantity to the A/D converter 22 and from there as a digital signal to the data processing device 23 for further processing.

It is an advantage of this embodiment of the present invention that the construction is simple and that usual commercial vacuum feedthroughs may be used. The apparatus according to the first embodiment comprises a relatively high sensitivity because of the great surface of the electrodes which are used in this embodiment. The bandwidth of this apparatus is limited by the upper limiting frequency of the current transformer and by parasitic inductivities of the feed lines as well as by stray capacitances to about 150 MHz.

According to another embodiment (not shown) of the present invention, it is further possible to replace the current transformer 46 in FIG. 4 by a terminal resistor 50 of preferably 50 Ohm, said resistor being for instance shown in FIG. 5.

It is emphasized that a vacuum is fed to the interior space of the vacuum feedthrough 44 and to the interior space 42 of the reactor. These spaces are gas tight with respect to the environmental atmosphere.

A further embodiment of apparatus 35 of the present invention is schematically and partly in cross-section shown in FIG. 5 wherein in the following identical or similar elements show the same reference numerals as in the first embodiment according to FIG. 4.

Regarding this embodiment, a probe 20 is again provided which is mounted on wall 5 of reactor 2 by means of the vacuum feedthrough 44. The probe 20 comprises an inner conductor 51 connected to the meter electrode 21, an insulating body 52 circumferentially surrounding the inner conductor 51, the insulation 37 of the meter electrode 21 and an outer conductor 53 connected to wall 5 of reactor 2. The outer conductor 53 should preferably be provided within the flange or recess, but as close as possible to the inner side of the reactor wall 5. This probe 20 thus corresponds to a coaxial cable having a constant characteristic wave impedance of preferably 50 Ohm so that probe 20 has nearly the same construction as the above mentioned coaxial cable. The inner conductor 51 passes the current I measured by the meter electrode 21 to the real terminal resistor 50. This resistor is electrically connected via the conductor 47 to outer conductor 53 and wall 5 (ground) of the reactor. The current in the inner and outer conductor have the same amount. No external magnetic fields thus appear in connection with such a probe.

According to FIG. 5, the probe 20 is connected to a coaxial cable 54. This connection is however not shown in detail in FIG. 5 and may for example be a so called BNC connector, thus a bushing/connector arrangement (male/female connection). It is further possible that the vacuum feedthrough 44 only extends up to the outer end of the probe 20 and is sealed against the probe. The insulation 37 as well as the insulating body 52 are preferably made of Teflon (PTFE).

According to FIG. 3, the probe 20 shown in FIG. 5 and 6 is connected to the A/D converter 22 having a thermal resistor 50 of preferably 50 Ohm via the coaxial cable 54 comprising the inner conductor 51, the insulating body 52 and the outer conductor 53. The characteristic wave impedance of said coaxial cable corresponds to the characteristic wave impedance of probe 20 and terminal resistor 50.

Since apparatus 35 according to the present invention is formed up to the actual meter electrode 21 as a coaxial cable (see FIG. 5), a wide bandwidth with respect to the frequency of the discharge current to be measured may be achieved by this probe. Thus, a transmission of the measured signal having a wide bandwidth may be performed free from reflections from the meter electrode to for example the entrance of the A/D converter 22. If the terminal resistor 50 has for example 50 Ohm, which corresponds to the characteristic wave impedance of the cable, the input resistance of the probe 20 is small if compared to the reactive impedance of the space charge capacity of the meter electrode 21 towards the plasma so that the RF potential in the reactor effected by the meter electrode is negligibly small if compared to the potential between the plasma and the earth electrode. For technical plasmas and excitation frequencies used therein below 50 MHz the diameter of the meter electrode 21 is about 5 mm.

A further preferred embodiment of apparatus 35 according to the present invention is schematically shown partly in cross-section in FIG. 6.

The vacuum feedthrough 44 shown therein is provided with a cover plate 55 which is securely connected to a flange-shaped shoulder 60 at the free end of the vacuum feedthrough 44 via a sealing ting 57 by means of damps 56 which are not shown in detail. The cover plate 55 comprises at both sides a coaxial connector 61 wherein the one end is preferably formed like a connector (male) and the other end is preferably formed like a bushing (female). The coaxial connector 61 which is directed to the wall 5 of the reactor is connected to a corresponding counter connector 62 which is not shown in detail in FIG. 6. The elements of this connection (inner conductor 51, insulating body 52, outer conductor 53) correspond to those of the embodiment according to FIG. 5. As a result, the inner conductor 51 is electrically directly connected to the actual meter electrode 21 and the outer conductor 53 is electrically connected with the wall 5 of the reactor 2 via a wall element 63. The insulting body 52 and the insulation 37 extend on the one hand between the inner conductor 51 and the meter electrode 21 and on the other hand between the outer conductor 53 and the wall element 63. The insulating body 52 and the insulation 37 as well as the cover plate 55 are preferably made of Teflon. According to FIG. 6, the cylindrical portion of the vacuum feedthrough 44 is welded to the side wall 5 of the reactor.

Regarding the last mentioned embodiment of the present invention, the discharge current flows from the meter electrode 21 via the inner conductor 51 and the conductor 24 shown in FIG. 3 to the A/D converter 22 and from said converter via a conductor 24 which is also formed as a coaxial cable, and the outer conductor 53 as well as the wall element 63 back to the side wall 5 of the reactor 2 which acts as a part of the earth electrode. It is apparent that the sealing ring 57 is formed like a vacuum sealing and that an unobjectionable electrical contact exists between the circumferential surface of the wall element 63 and the side wall 5 of the reactor.

The excitation in the discharge current may be measured with a wide bandwidth up to about 500 MHz by the apparatus according to the last mentioned embodiment of the present invention. This measurement is relatively independent of the distance between probe 20 and A/D converter 22.

What I claim is:

1. A method for the determination of absolute plasma parameters of unsymmetrical radio frequency (RF) low-pressure plasmas which comprises:
    a) generating an alternating electric field of radio frequency in a plasma reactor by exciting an RF electrode at a driving radio frequency between about 10 MHz and 100 MHz, to create an oscillating discharge current, the discharge current having at least one resonant frequency, the oscillation of the discharge current modified by the electric field resulting from a non-linear space charge sheath adjacent the RF electrode, the oscillation therefore having a Fourier spectrum with peaks at the driving radio frequency and at each resonant frequency of the discharge current;
    b) measuring the radio frequency discharge current generated in said plasma reactor at a portion of said plasma reactor acting as an earth electrode and convening the measured current into electric voltage in the form of analog signals;
    c) converting the analog signals of b) into distal signals; and
    d) evaluating the plasma parameters from the digital signals of c) by means of a mathematical algorithm.

2. Method according to claim 1, characterized in that at least one resonant frequency of the discharge is determined from how the discharge current varies in time.

3. Method according to claim 1, characterized in that the ion density distribution in the harmonic oscillation in front of the RF electrode is determined from how the discharge current varies in time, wherein how the discharge current varies in time is determined by measuring how only a partition of the discharge current varies in time, said partition being that amount of the discharge current that impinges on a meter electrode positioned away from the earth electrode, said partition being approximately independent from the driving radio frequency.

4. Method according to claim 3, characterized in that the partition of the discharge current is estimated in a first approach by the ratio of the area of the portion of the reactor that acts as earth electrode to the area of the portion of the reactor that acts as the RF electrode.

5. Method according to claim 1, characterized in that the damping constant of the discharge current, which is dampedly oscillating by reason of collisions of electrons comprised by the discharge current with neutral particles of the plasma, is determined from measuring how the discharge current varies in time.

6. Method according to claim 1, characterized in that at least the dc part of the potential at the RF electrode is measured for determining the absolute value of the average thickness of the space charge sheath in front of the RF electrode and for determining the average ion energy.

* * * * *

UNITED STATES PATENT AND TRADEMARK OFFICE
CERTIFICATE OF CORRECTION

PATENT NO. : 5,705,931
DATED : January 6, 1998
INVENTOR(S) : Michael KLICK

It is certified that error appears in the above-indentified patent and that said Letters Patent is hereby corrected as shown below:

Column 4, line 42, "Which" should be -- which --;

Column 7, line 13, "serf" should be -- self --;

Column 11, line 23, "ting" should be -- ring --; and

Column 11, line 23, "damps" should be -- clamps --.

In the Claims:

Claim 1, column 12, line 21, "convening" should be
    -- converting --; and

Claim 1, column 12, line 23, "distal" should be -- digital --.

Signed and Sealed this

Eighteenth Day of August, 1998

Attest:

BRUCE LEHMAN

Attesting Officer         Commissioner of Patents and Trademarks